(12) United States Patent
Bouda et al.

(10) Patent No.: US 6,847,662 B2
(45) Date of Patent: Jan. 25, 2005

(54) WAVELENGTH-SELECTABLE LASER CAPABLE OF HIGH-SPEED FREQUENCY CONTROL

(75) Inventors: Martin Bouda, Sunnyvale, CA (US); Ken Morito, Kawasaki (JP); Kazumasa Takabayashi, Kawasaki (JP); Tadao Nakazawa, Kawasaki (JP); Naoki Hashimoto, Kawasaki (JP); Hiroshi Onaka, Kawasaki (JP); Yuji Kotaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 31 days.

(21) Appl. No.: 10/352,044

(22) Filed: Jan. 28, 2003

(65) Prior Publication Data
US 2003/0179790 A1 Sep. 25, 2003

(30) Foreign Application Priority Data

Mar. 25, 2002 (JP) .................................... 2002-084254
Aug. 12, 2002 (JP) .................................... 2002-234462

(51) Int. Cl.$^7$ .............................................. H01S 3/10
(52) U.S. Cl. ........................................ 372/20; 372/98
(58) Field of Search ....................... 372/13, 20, 26–28, 372/92, 98, 106

(56) References Cited

U.S. PATENT DOCUMENTS 5,724,373 A * 3/1998 Chang ........................ 372/20
5,970,076 A 10/1999 Hamada ....................... 372/20
6,091,744 A 7/2000 Sorin et al. ................. 372/20

FOREIGN PATENT DOCUMENTS

JP  2000-261086  9/2000

OTHER PUBLICATIONS

Paul W. A. McIlroy, IEEE, Journal of Quantum Electronics, vol., 26, No. 6, Jun. 1990, pp. 991–997.

* cited by examiner

Primary Examiner—Quyen Leung
(74) Attorney, Agent, or Firm—Armstrong, Kratz, Quintos, Hanson & Brooks, LLP

(57) ABSTRACT

A wavelength-selectable laser with a resonance region formed by two reflecting surfaces include a gain medium generating a laser beam, a first filter, and a second filter. The first filter has a first controllable transmission region and transmits a first predetermined wavelength region of the laser beam generated in the gain medium, the first predetermined wavelength region matching the first controllable transmission region. The second filter has a plurality of periodically arranged second transmission regions and transmits a second predetermined wavelength region of the laser beam transmitted by the first filter, the second predetermined wavelength region matching one of the second transmission regions.

35 Claims, 16 Drawing Sheets

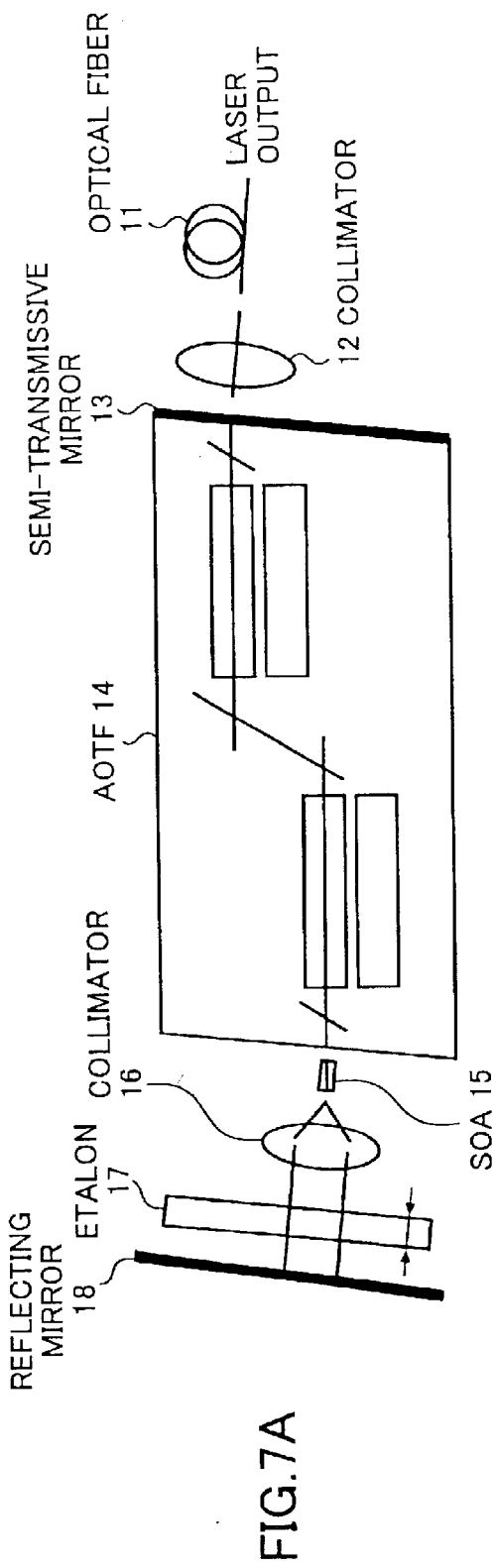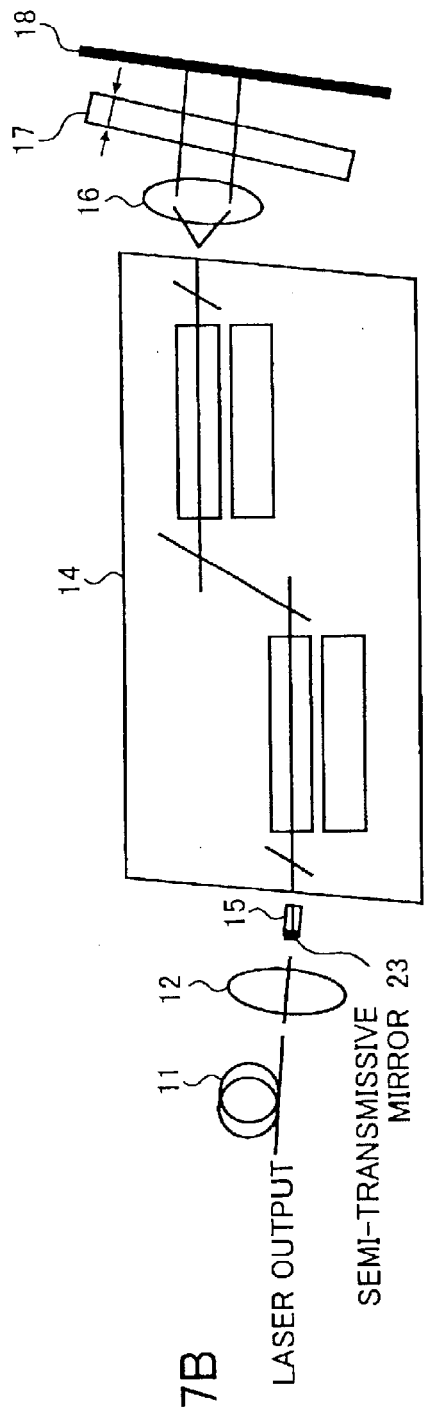
FIG.7A
FIG.7B

WAVELENGTH-SELECTABLE LASER CAPABLE OF HIGH-SPEED FREQUENCY CONTROL

CROSS-REFERENCE TO RELATED APPLICATION

The present application is based on Japanese Laid-Open Patent Applications No. 2002-084254 filed on Mar. 25, 2002 and No. 2002-234462 filed on Aug. 12, 2002, the entire contents of which are hereby incorporated by reference.

BACKGROUND OF THE INVENTION

1. Field of the Invention

The present invention generally relates to wavelength-selectable lasers, and more particularly to a wavelength-selectable laser whose oscillation frequency can be tuned over a required frequency bandwidth.

2. Description of the Related Art

Lasers are composed of an optical cavity including a gain medium, and obtain oscillation by increasing the gain. With the recent rapid increase in demand for communication, wavelength division multiplexing (WDM) communication systems that multiplex a plurality of signal beams having different wavelengths to enable mass transmission through a single optical fiber have been developed. Such wavelength division multiplexing optical fiber communication systems require a wavelength-selectable laser that can select light of a desired wavelength at high speed with accuracy from within a wide wavelength range.

In devices that multiplex wavelengths while controlling oscillation to a desired single wavelength, it is extremely desirable that a wavelength range broader than 60 nm, which corresponds to the two most commonly used frequency bands (1530–1560 nm and 1570–1610 nm) in optical fiber communication devices, be effectively selectable.

Oscillation wavelengths are required to be tuned at a speed faster than a few milliseconds to maintain virtually uninterrupted operation of such devices.

Such tuning is enabled by wavelength-selectable lasers disclosed in U.S. Pat. No. 6,091,744 to Sorin et al. (hereinafter referred to as first prior art), part of U.S. Pat. No. 5,970,076 to Hamada (hereinafter referred to as second prior art), and Japanese Laid-Open Patent Application No. 2000-261086 by Inoue (hereinafter referred to as third prior art).

FIG. 1 is a block diagram showing the configuration of a wavelength-selectable laser according to the first prior art. The wavelength-selectable laser of FIG. 1 includes a gain medium 101, a reflecting mirror 102, a bandpass filter 103, a frequency controller 104, a plurality of fiber Bragg grating (FBG) reflective filters 106, and a single-mode optical fiber 107.

In this configuration, the transmission characteristics of the bandpass filter 103 and the FBGs 106 are tunable. Further, laser oscillation occurs at the frequencies where the peak of bandpass transmission coincides with the peak of FBG reflection. Broad mode tuning is realized by using the FBGs 106 reflecting different narrow frequency bands. The bandpass filter 103 is used to transmit a selected one of the reflection spectra of the FBGs 106. Each of the FBGs 106 is tunable to a desired wavelength within its tuning range which wavelength is connectable to a propagation channel.

When employed in the case of using a large number of FBGs as tunable reflective filters, the above-described method has the disadvantage that two complicated and expensive filters should be tuned simultaneously. With the FBG characteristics being fixed, the above-described method requires as many FBGs as the number of desired wavelength channels, so that the optical cavity is elongated to increase the size and cost of the laser.

Next, FIG. 2 is a block diagram showing a wavelength-selectable laser according to the second prior art. The wavelength-selectable laser of FIG. 2 includes a gain medium 111, a reflecting mirror 112, a collimator lens 113, a reflecting grating 116 formed of a diffraction grating, and a cavity 117.

According to this configuration, wavelength selection is achieved by mechanically rotating the reflecting grating 116. That is, the reflection peak wavelength of the reflecting grating 116 is tuned by rotating the reflecting grating 116.

This configuration has the disadvantage of requiring a large mechanical configuration in size for wavelength tuning. That is, in order to realize the second prior art, the feedback system of the rotation angle of the reflecting grating and a complicated and expensive tuning device are required. Further, mechanical tuning results in a tuning delay of the order of milliseconds with mechanical stability and reliability being a matter of concern.

A wavelength-selectable laser according to the third prior art includes an acousto-optical tunable filter (AOTF) and a gain medium. According to the configuration of the third prior art, part of light generated in the gain medium to have a wide wavelength range is selected by the AOTF. That is, a surface acoustic wave (SAW) is generated by applying an RF signal to the inter digital transducer of the AOTF so that the surface acoustic wave and propagating light interact with each other to switch the polarization mode of propagating light of a specific wavelength corresponding to the frequency of the RF signal between TE and TM. The light of the specific wavelength is selected using a polarization beam splitter.

However, according to the third prior art, laser oscillation is destabilized by the occurrence of a Doppler frequency shift, and it is extremely difficult to select light of a specific single wavelength using the AOTF.

Other devices such as fiber ring lasers including a tunable filter and an erbium-doped fiber amplifier are slow in gain response and require a relatively long period of time of the order of a few milliseconds in switching wavelengths.

In this current situation, stability is required in a single-mode laser device with highly suppressed multi-mode oscillation. In the WDM devices (the optical fiber communication devices), a tuning range of 30 to 60 nm and an oscillation wavelength accuracy of the order of tens of nanometers, for instance, are required.

A signal laser oscillation wavelength should be selected with accuracy in the order of tens of microseconds from a large number of specific wavelengths in a wide wavelength range. Further, in consideration of cost, the control mechanism should be simple with as small a feedback configuration for frequency control as possible.

Thus, there is difficulty in downsizing the conventional wavelength-selectable laser, and it is difficult for the conventional wavelength-selectable laser to select light of a specific wavelength or frequency from a broad frequency range in a short period of time with accuracy.

SUMMARY OF THE INVENTION

Accordingly, it is a general object of the present invention to provide a wavelength-selectable laser in which the above-described disadvantages are eliminated.

A more specific object of the present invention is to provide a wavelength-selectable laser that can perform fast and accurate frequency control with a simple and downsized configuration.

The above objects of the present invention are achieved by a wavelength-selectable laser having a resonance region formed by two reflecting surfaces, the wavelength-selectable laser including: a gain medium generating light; a first filter having a first controllable transmission region and transmitting a first predetermined wavelength region of the light generated in the gain medium, the first predetermined wavelength region matching the first controllable transmission region; and a second filter having a plurality of periodically arranged second transmission regions and transmitting a second predetermined wavelength region of the light transmitted by the first filter, the second predetermined wavelength region matching one of the second transmission regions.

The above-described wavelength-selectable laser can perform high-speed frequency control with the following configuration:

a gain medium consisting of a semiconductor; a first filter generating a surface acoustic wave in a light waveguide with application of an RF signal and selectively transmitting light of a frequency range corresponding to a frequency of the RF signal; and a frequency control part controlling the frequency of the RF signal based on a magnitude of a beat signal included in an output light of the resonator, the beat signal having a frequency N times the frequency of the RF signal, N being an integer larger than zero.

According to the above-described wavelength-selectable laser, the first filter is controlled by the frequency of the RF signal so that a laser beam within a specific one of the transmission frequency ranges of the second filter can be transmitted selectively. When the RF signal has a frequency that maximizes the efficiency of polarization mode conversion with respect to the transmission frequency of the second filter, the beat signal is minimized. Accordingly, by controlling the frequency of the RF signal so that the beat signal is minimized or set to be smaller than or equal to a predetermined value, light of the transmission frequency of the second filter can be transmitted with maximum efficiency. That is, by controlling the frequency of the RF signal based on the magnitude of the beat signal of the output light, a laser beam can be controlled to a desired frequency at high speed with accuracy.

BRIEF DESCRIPTION OF THE DRAWINGS

Other objects, features and advantages of the present invention will become more apparent from the following detailed description when read in conjunction with the accompanying drawings, in which:

FIGS. 7A and 7B are diagrams showing more specific configurations of the wavelength-selectable laser according to the first embodiment of the present invention;

DETAILED DESCRIPTION OF THE PREFERRED EMBODIMENTS

Figure 1:
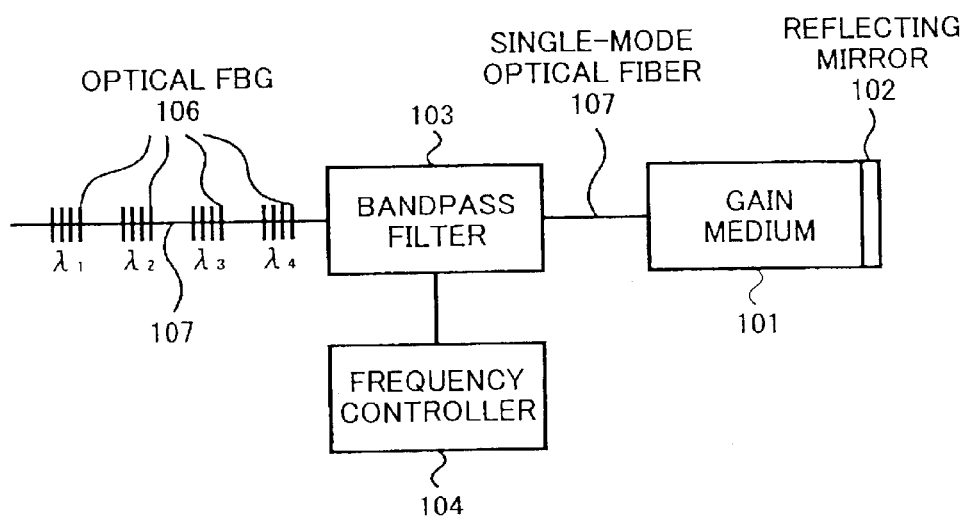
FIG. 1 is a block diagram showing the configuration of a wavelength-selectable laser according to a first prior art.
Figure 2:
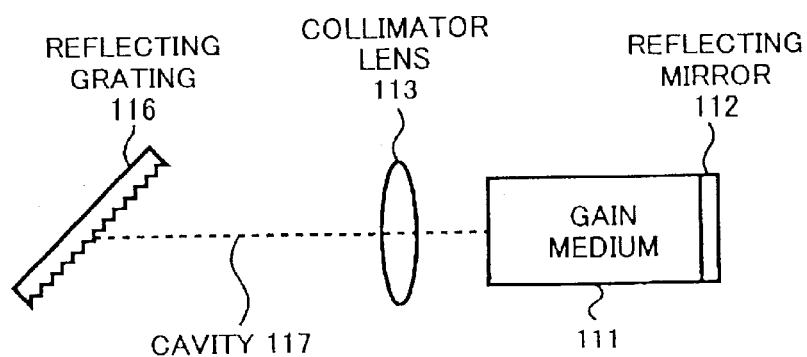
FIG. 2 is a block diagram showing the configuration of a wavelength-selectable laser according to a second prior art.

First, a description will be given of the principles of the present invention.

The present invention provides a wavelength-selectable laser for rapidly selecting a single oscillation frequency from a set of longitudinal optical modes of a laser resonator over a broad range of optical frequencies.

Single longitudinal mode control with high suppression of oscillation at undesired frequencies is realized by: (a) filtering an optical energy spectrum by a second periodic optical bandpass transmission filter (hereinafter referred to as a second bandpass filter), the second bandpass filter having a free spectral range equal to a desired wavelength channel spacing and having a transmission peak narrow enough to select one longitudinal mode of the laser cavity; and (b) next choosing one of the multiple transmission peaks caused by the second bandpass filter by a first optical bandpass transmission filter (hereinafter referred to as a first bandpass filter). Laser oscillation is realized by providing the above-described components in the cavity of the resonator and optically coupling the components. Solid-state tunable filters are used for the first and second bandpass filters.

The characteristic of a wavelength-selectable laser with a conventional bandpass filter for selecting one longitudinal mode depends on the spacing between adjacent longitudinal modes and the sharpness of the transmission peak of the bandpass filter. Practically, the sharpness of available tunable bandpass filters is limited. Therefore, according to the present invention, a sharp transmission characteristic is obtained by using a transmission filter having as narrow a transmission full width at half maximum as possible as the second bandpass filter. Further, according to the present invention, the cavity is reduced in length as much as possible so that the spacing between adjacent longitudinal modes increases, thereby increasing the loss difference.

A semiconductor optical amplifier (SOA) may be used as the gain medium of the above-described wavelength-selectable laser. By using a semiconductor device as the gain medium, the gain medium can be formed with relatively reduced length in the direction of the waveguide and the response time of the gain medium can be decreased. Further, an AOTF, which is an acousto-optical element, may be used for the first bandpass filter. A Fabry-Perot (FP) etalon filter may be used as the second bandpass filter. These components are provided in the waveguide path in the cavity formed between two reflecting surfaces. A partially reflective mirror is used for at least one of the two reflecting surfaces. The transmission rate of the partially reflective mirror varies as required.

The frequencies of the transmission peaks of the FP etalon filter can be designed and arranged so as to match specific wavelengths standardized by the ITU (International Telecommunications Union) grid specifications. As a result, the laser beam can be output at an accurate frequency without requiring a frequency control circuit having a feedback configuration, such as a frequency locker.

According to the present invention, the above-described configuration allows a single mode to be obtained with the other longitudinal modes being highly suppressed, and allows the frequency of the output laser beam to be selected at high speed. These effects are obtained as a result of reducing the cavity of the laser device in length by removing an optical fiber and of using a periodic filter (FP etalon filter) having a narrow transmission peak.

The first bandpass filter is tunable and suppresses oscillation at periodic transmission peaks other than a desired frequency. Additionally, the second bandpass filter may have desired frequency peaks matching the ITU grid with accuracy so as to allow easy and quick tuning to a frequency standardized by the ITU grid.

A description will now be given, with reference to the accompanying drawings, of embodiments of the present invention.

[First Embodiment]

Figure 3:
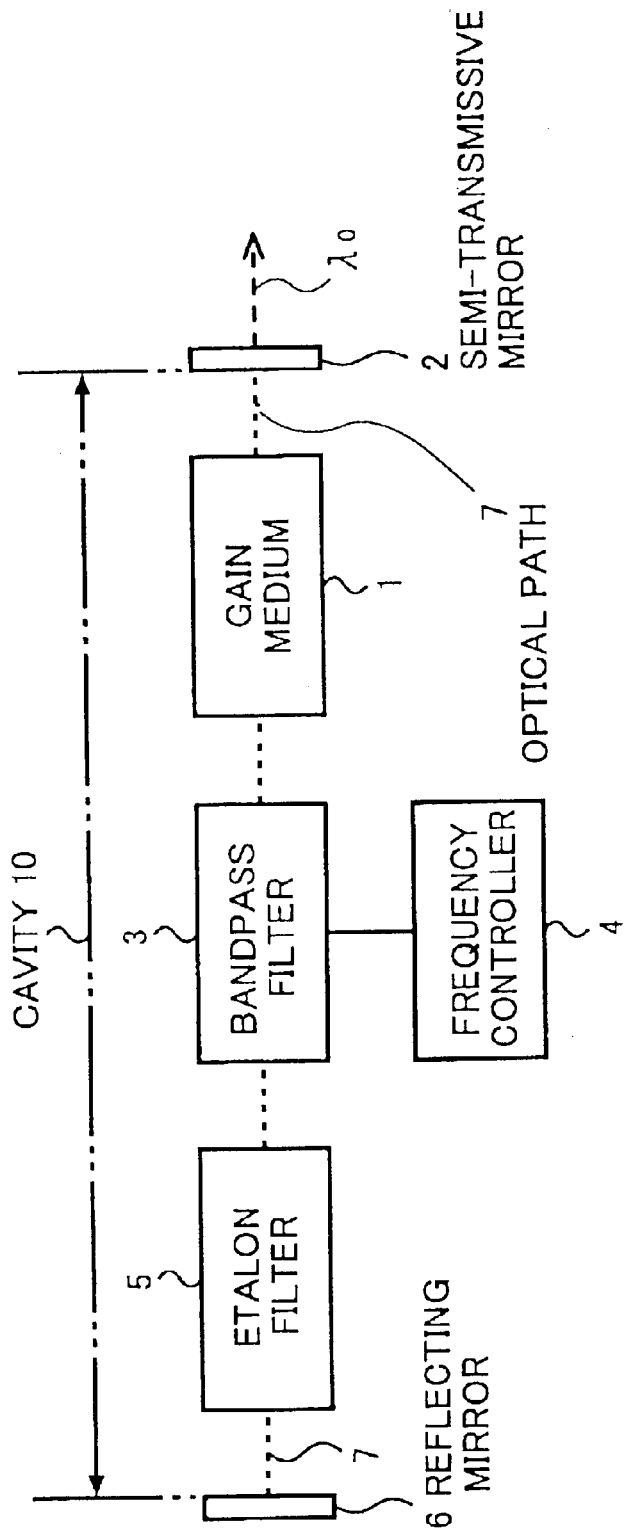
FIG. 3 is a block diagram showing a wavelength-selectable laser according to a first embodiment of the present invention.

FIG. 3 is a block diagram showing a wavelength-selectable laser according to a first embodiment of the present invention.

According to the wavelength-selectable laser of the first embodiment, a cavity 10 serving as a laser resonator is formed between two reflecting surfaces, i.e., a partially transmissive (semi-transmissive or half) mirror 2 and a reflecting mirror 6. The two reflecting surfaces include at least one semi-transmissive mirror so as to extract a laser beam from the cavity 10. A single-mode optical fiber is connected to the output side of the semi-transmissive mirror 2.

A gain medium 1 for generating optical energy and a solid-state tunable bandpass filter 3 are provided in the cavity 10. The optical energy is generated in a semiconductor optical amplifier (SOA) in the gain medium 1 so as to be distributed typically over a broad frequency range of approximately 100 nm. The bandpass filter 3, which is equivalent to the above-described first bandpass filter, that is, an AOTF, for instance, has its transmission characteristic controlled without a mechanical configuration. Further, as shown in FIG. 5B, the bandpass filter 3 has a relatively wide transmission characteristic. The bandpass filter 3 has a predetermined transmission frequency range. The power of the laser beam is monitored on the extension of the optical fiber connected to the semi-transmissive mirror 2 so that the gain of the gain medium 1 is controlled based on the monitoring results.

Further, as a third basic configuration, an (FP) etalon filter 5, which has a large number of periodically spaced narrow transmission peaks, is provided as the second bandpass filter in the cavity 10. As shown in FIG. 5C, the etalon filter 5 has periodically spaced high transmission peaks, or a plurality of periodic and discrete transmission frequency ranges, based on the distance between the reflecting films on both its surfaces.

All of the above-described optical elements provided in the cavity 10 are positioned in an optical path (waveguide) 7, which is a resonance-generating region formed between the semi-transmissive mirror 2 and the reflecting mirror 6 forming the cavity 10. That is, the gain medium 1, the bandpass filter 3, and the etalon filter 5 are provided along the optical path 7 in the cavity 10.

Figure 4:
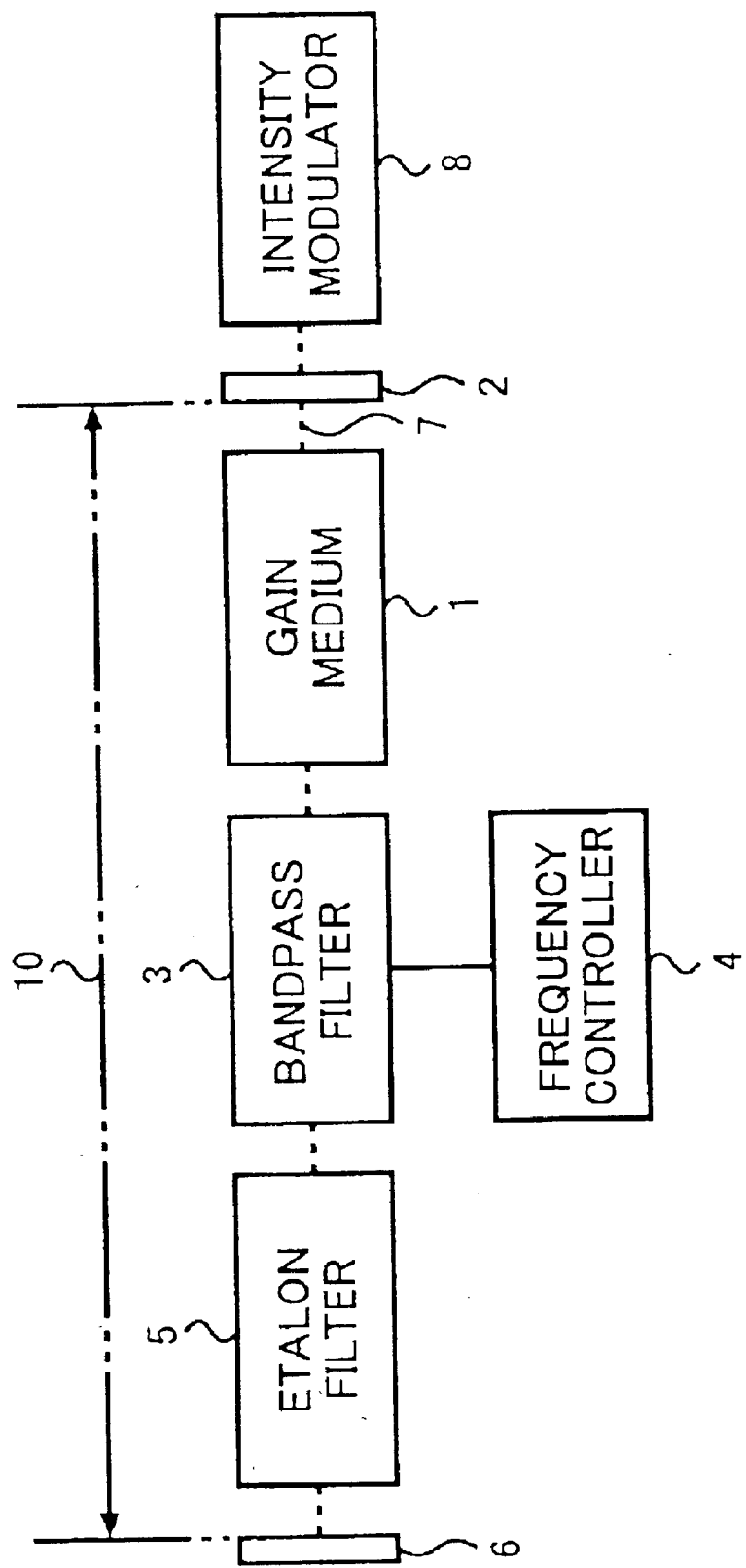
FIG. 4 is a block diagram showing another configuration of the wavelength-selectable laser of FIG. 3 according to the first embodiment of the present invention.

A frequency controller 4 controls the transmission characteristic or transmission frequency of the bandpass filter 3 so as to select a desired oscillation frequency. Optionally, as shown in FIG. 4, an intensity modulator 8 may be provided on one end (the laser beam output side) of the wavelength-selectable laser so as to modulate the output laser beam. Thereby, a data signal can be modulated.

Figure 5A:
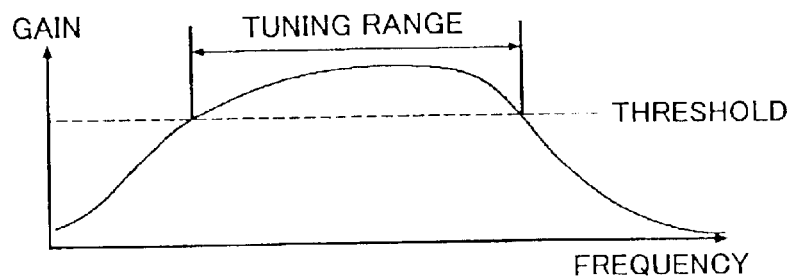
FIGS. 5A through 5D are diagrams for illustrating the operation of the wavelength-selectable laser of FIG. 3 according to the first embodiment of the present invention.
Figure 5B:
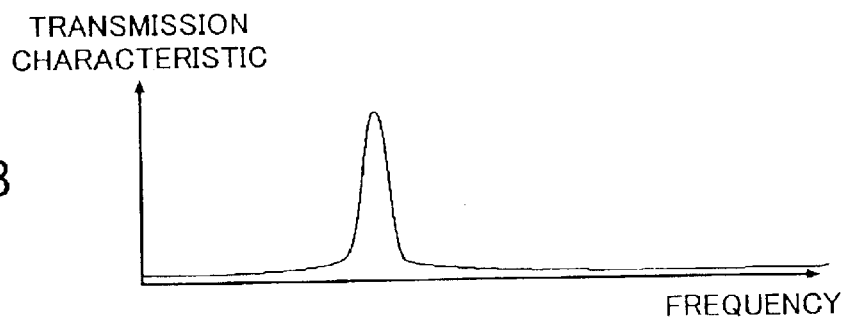
Figure 5C:
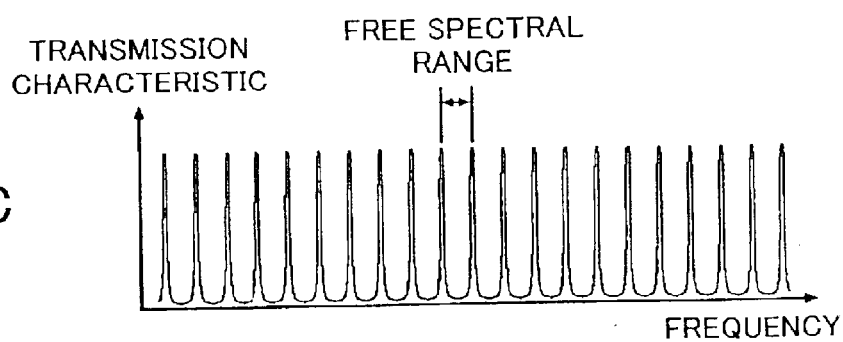

FIGS. 5A through 6D are diagrams for illustrating the operation of the wavelength-selectable laser of FIG. 3, showing the characteristics thereof. FIG. 5A is a graph showing a typical gain spectrum in the gain medium (semiconductor optical amplifier device) 1, which does not employ optical feedback. The gain medium 1 of this embodiment employs a multiple-quantum well (MQW) semiconductor. In FIG. 5A, the horizontal axis represents frequency, the vertical axis represents gain, and the broken line indicates a minimum gain level required for laser oscillation to occur in a laser device with round-trip loss. The value corresponding to the broken line is a threshold that is a condition for laser oscillation. That is, laser oscillation can be controlled in a frequency range where the gain is larger than or equal to the threshold.

FIG. 5B is a graph showing the transmission characteristic of the bandpass filter 3. In FIG. 5B, the horizontal axis represents frequency and the vertical axis represents transmission rate. As will be made apparent by its operation principles described later, the bandpass filter 3, which is an AOTF, transmits light of a predetermined frequency range specified by the frequency of an applied RF signal, and filters out light of frequencies outside the predetermined frequency range. Since the FP etalon filter 5, which is the second filter, has a wide transmission peak spacing and a narrow band, light of a single longitudinal mode can be selected by combining the bandpass filter 3 and the etalon filter 5 when the bandpass filter 3 has a relatively broad transmission frequency range.

FIG. 5C is a graph showing the periodic transmission frequency range characteristic of the FP etalon filter 5. In FIG. 5C, the horizontal axis represents frequency and the vertical axis represents transmission rate. An FP etalon filter has reflecting films formed on both sides thereof, and transmits only light of resonating wavelengths in accordance with the distance between the reflecting films. Accordingly, the FP etalon filter 5 has the transmission characteristic of periodically appearing narrow transmission frequency bandwidths. A preferable FP etalon filter is designed so as to have its periodic transmission frequency bandwidths matching the frequencies of the ITU grid. As a result, a plurality of frequencies transmitted by the FP etalon filter match the frequencies employable in the WDM communication systems, and by selecting one of the transmitted frequencies in an AOTF, a laser beam used in optical communication can be generated.

Figure 5D:
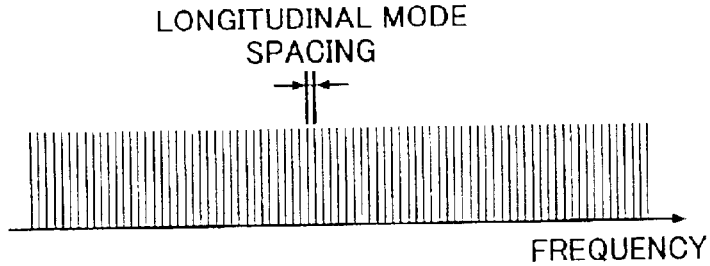

FIG. 5D shows the frequency spectra of longitudinal modes oscillating in the cavity 10.

Laser oscillation occurs in the cavity 10 only at a frequency that satisfies the following two conditions at the same time. The first condition is that a phase change caused by one round-trip of a light wave should be a multiple of 360°. This condition is essential to obtain laser oscillation.

The second condition is that the total loss and the total gain generated by one round trip are basically of the same magnitude. Generally, laser oscillation occurs mainly around a frequency at which the round-trip loss is minimized. As cavity length is reduced, frequency spacing becomes relatively wider.

The longitudinal modes allowed by these conditions are given as a plurality of overlapped spectra as shown in FIG. 5D. For instance, if a cavity of L in length is filled uniformly with a medium of a refractive index n, a frequency spacing fd between adjacent longitudinal modes is given as fd=c/(2 nL), where c is the velocity of light under vacuum.

According to fd=c/(2 nL), as L increases, fd becomes smaller. Therefore, it is difficult for the conventional tunable bandpass filter to select one longitudinal mode when the element length is long. On the other hand, according to the present invention, the tunable bandpass filter 3 is allowed to have a relatively broad transmission band, so that the element length can be short. Therefore, the length L of the cavity 10 can be set as short as possible.

Figure 6A:
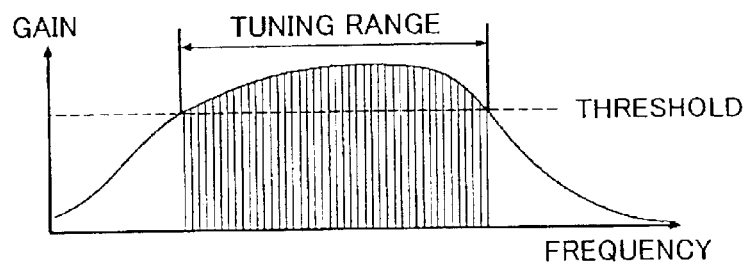
FIGS. 6A through 6D are diagrams for illustrating the operation of the wavelength-selectable laser of FIG. 3 according to the first embodiment of the present invention.

FIG. 6A is a graph showing the combination of the frequency spectra of the longitudinal modes of FIG. 5D and the gain characteristic of the gain medium 1 of FIG. 5A. Laser oscillation can occur at the longitudinal modes in the frequency band where the gain is higher than the threshold that corresponds to the cavity loss.

Figure 6B:
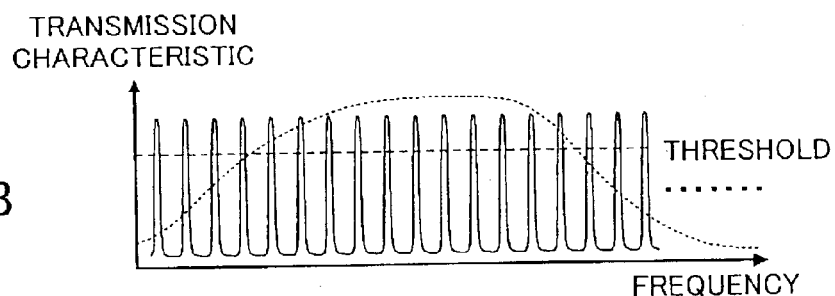

FIG. 6B shows the transmission characteristic of the FP etalon filter 5 superimposed on the graph of FIG. 6A. As shown in FIG. 6B, the number of longitudinal modes that can cause laser oscillation is very limited due to the periodic and narrow transmission bands of the FP etalon filter 5.

Figure 6C:
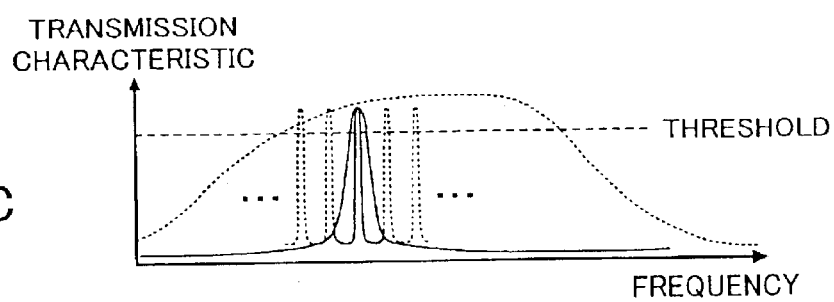
Figure 6D:
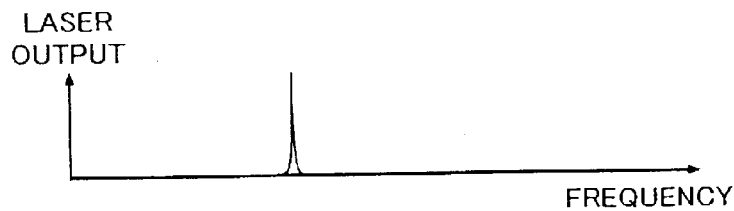

FIG. 6C shows the transmission characteristic of the bandpass filter 3 superimposed on the graph of FIG. 6B. As shown in FIG. 6C, only one of the periodic and narrow transmission frequency bands transmitted by the FP etalon filter 5 is selected by the transmission characteristic of the bandpass filter 3 although the bandpass filter 3 has a relatively broad transmission frequency band. As a result, a laser beam of a single longitudinal mode as shown in FIG. 6D is selected.

According to this embodiment, the frequency of a laser beam generated by oscillation is controlled by controlling the frequency dependency of the round-trip losses of the longitudinal modes by using the above-described two filters, that is, the bandpass filter 3 and the etalon filter 5. Thereby, the problem that a large number of longitudinal modes compete for energy as shown in FIG. 6A is avoided in the present invention. Without a configuration that causes differences among losses in the cavity 10, conventionally, a large number of longitudinal modes compete for energy as shown in FIG. 6A.

It is required to cause sufficiently large loss differences among the longitudinal modes in order to perform single-mode control on a laser device in which unnecessary longitudinal modes in the gain spectrum of the gain medium 1 are highly suppressed. This is required particularly of adjacent optical longitudinal modes.

The extent to which adjacent longitudinal modes are suppressed is expressed as side-mode suppression ratio (SMSR). The SMSR relates to the minimum loss difference between longitudinal modes. This theory is disclosed in "Calculation of the Mode Suppression Ratio in Fabry-Perot, DBR, and External Cavity Lasers" by McIlroy, IEEE Journal of Quantum Electronics, vol. 26, no. 6, June 1990. According to the theory disclosed in this document, an SMSR of 40 dB or higher can be obtained if there is a loss difference of 1 dB between adjacent longitudinal modes. If the longitudinal modes are densely distributed, however, it is difficult to use a short single tunable filter having a wavelength tunable width of 100 nm and a loss difference of 1 dB with respect to a mode spacing of 1 GHz.

On the other hand, according to this embodiment, the two types of filters are employed to relax filter requirements. One is the periodic etalon filter 5, whose typical characteristic is shown in FIG. 5C. The etalon filter 5 has a narrow transmission bandwidth that easily realizes narrow transmission peaks. Therefore, according to the present invention, an FP etalon filter having a range of a 1 dB loss difference between longitudinal modes and a finesse of approximately 20 can be used as the etalon filter 5.

The free spectral range of the etalon filter 5 is set so as to approximate the frequency spacing of the ITU grid. Complete matching with the frequencies of the ITU grid is preferred. The value of the frequency spacing is typically 100 or 50 GHz, or approximately 0.8 or 0.4 nm in wavelength. An etalon of an air-gap type can be employed as the etalon filter 5. Further, in order to avoid oscillation at frequencies other than a selected frequency, it is required for the bandpass filter 3 to have a wavelength tunable width at least larger than or equal to the gain width of the gain medium 1. According to this embodiment, however, the requirement for the transmission characteristic of the bandpass filter 3 is relaxed. This is because the loss difference is required between frequencies spaced 0.4 or 0.8 nm apart from each other.

In this embodiment, one longitudinal mode can be selected by including the above-described optical components since the spectrum of a longitudinal mode to be transmitted can be selected by the etalon filter 5 serving as the second bandpass filter. This selection is shown in FIG. 6C. As a result, a large number of longitudinal modes are filtered out. Since the etalon filter 5 has a relatively wide transmission peak spacing, the bandpass filter 3 may have a relatively broad bandwidth. The spectrum of an optical mode obtained in the case of applying the configuration of this embodiment to an optical resonator providing optical feedback is shown in FIG. 6D.

In this embodiment, an AOTF is applied as the tunable bandpass filter 3. The AOTF is an optical filter that changes its transmission characteristic by interaction between an optical output and an SAW. The SAW applied to the AOTF is generated by applying a radio frequency (RF) to an electrode provided to a birefringent material such as $LiNbO_3$. The generated SAW is transmitted along a waveguide in the AOTF (bandpass filter 3). At this point, the TE/TM polarization mode conversion of light occurs in the waveguide in the bandpass filter 3. This polarization occurs around the center of the frequencies related to the frequency of the SAW. By using a polarization splitter filter, the frequency band can be guided from an input toward the output direction of a first waveguide and the remaining output toward the output direction of a second waveguide.

The frequency at which the mode conversion occurs can be controlled at high speed by changing the SAW frequency. In the process of switching the SAW frequency from #1 to #2, the transmission characteristic of the AOTF can be tuned to both wavelengths #1 and #2 before the wavelength #1 is released. This is one unique feature of the AOTF based on its capability of superimposing two RF waves. According to this configuration, light emission at an intermediate wavelength during the mode selection control, and control speed can be increased.

Using the AOTF as the bandpass filter 3, however, entails the inherent problem caused by using the SAW. That is, the velocity of the SAW causes a Doppler shift in an optical frequency. Therefore, according to this embodiment, the Doppler shift in a frequency is eliminated by using two connected equivalent AOTF elements, so that constant output controllability can be obtained.

When the SAW propagates in the same direction as a light wave, a positive Doppler shift occurs when the polarization mode of the light wave is converted from TE to TM. On the other hand, a negative Doppler shift occurs when the polarization mode is converted from TM to TE. When the light wave and the SAW propagate in the opposite directions, a reverse Doppler shift occurs in each of the above-described cases.

FIGS. 7A and 7B are diagrams showing more specific configurations of the wavelength-selectable laser according to this embodiment. In these configurations, an etalon 17 is provided as close to a reflecting surface (reflecting mirror) 18 as possible. When the etalon 17 is provided to face an AOTF 14 as shown in FIG. 7B, a semi-transmissive mirror 23 is provided directly to one surface of an SOA 15. On the other hand, when the SOA 15 is provided between the AOTF 14 and the etalon 17 as shown in FIG. 7A, a semi-transmissive mirror 13 is provided directly to one surface of the AOTF 14. Thereby, the cavity length can be reduced.

By arranging the etalon 17 and the reflecting mirror 18 in the position farthest removed from the SOA 15 so that the laser beam of the wavelength-selectable laser can be extracted from the semi-transmissive mirror 23 provided to the SOA 15 as shown in FIG. 7B, light transmitted by the etalon 17 and light not transmitted thereby can be distinguished clearly in intensity, so that a desired laser beam can be output definitely.

The switching speed of the bandpass characteristic of the AOTF 14 is related to time required for the SAW to propagate from end to end of the interaction region. This time can be reduced to 10 μs, thus enabling rapid frequency switching.

In order to output a laser beam from a cavity formed between reflecting surfaces, at least one of the reflecting surfaces should be a semi-transmissive mirror. Hence, the semi-transmissive mirror 13 or 23.

A high-performance wavelength-selectable laser is required to reduce loss in the entire cavity. The main cause of the loss is coupling loss. A spot-size converter provided to each of the amplifier (SOA) 15 and the AOTF 14 for spot size matching is suitable for reducing coupling loss.

Undesired reflection causes an extremely great variation in the gain characteristic of the SOA 15. The configuration of FIG. 7A eliminates this disadvantage. As shown in FIG. 7A, an anti-reflection (AR) coating is provided to each of the surfaces of the SOA 15, thereby realizing non-reflection single surface output.

According to the configuration of FIG. 7B, the SOA 15 is provided as far from the etalon 17 as possible. A low-reflection coating or a cleavage plane is formed on one surface and an AR coating is provided to the other surface of the SOA 15. Thereby, light reflected back from the reflecting mirror 18 after passing through the second filter (etalon 17) and light reflected back from the etalon 17 are prevented from entering the SOA 15 in a mixed state.

The cavity length can be reduced and the wavelength-selectable laser can be made more compact by using collimator lenses 12 and 16 in order to connect the SOA 15 and the AOTF 14 with the other parts of the laser. The cavity length can be reduced further by omitting the collimator lenses 12 and 16 by connecting the SOA 15 and the AOTF 14 with the other parts of the laser through butt-joint coupling.

Figure 8:
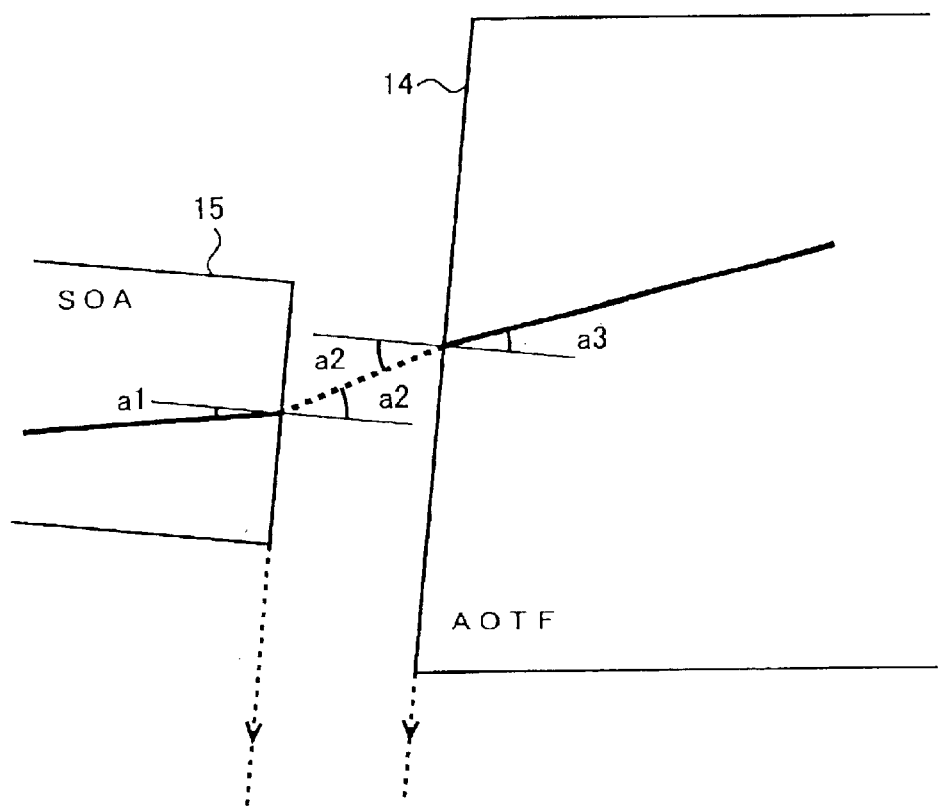
FIG. 8 is a diagram showing a configuration between an SOA and an AOTF of the wavelength-selectable laser shown in FIG. 7A or 7B according to the first embodiment of the present invention.

The SOA 15 and the AOTF 14 can be made closer to each other by setting predetermined angles a1 and a3 with respect to the, opposing surfaces of the SOA 15 and the AOTF 14, respectively, as shown in FIG. 8. The predetermined angles a1 and a3 are set so that the waveguide of a light beam traveling between the SOA 15 and the AOTF 14 forms the same angle a2 with respect to the output surface of each of the SOA 15 and the AOTF 14. The predetermined angles a1 and a3 are set by arranging the opposing output surfaces of the SOA 15 and the AOTF 14 parallel to each other as shown in FIG. 8.

By tilting the SOA 15 and/or the AOTF 14 with respect to the waveguide, a complex resonator is prevented from being created in the SOA 15 and/or the AOTF 14.

The second key issue is to eliminate undesired reflection between the reflecting surfaces in the cavity. The undesired reflection can be eliminated by tilting the surface of the SOA 15 and slightly tilting the etalon 17 with respect to the waveguide. Thereby, the etalon 17 can be adjusted so as to transmit the frequencies of the ITU grid. An AR coating is provided to each of the surfaces.

Figure 9:
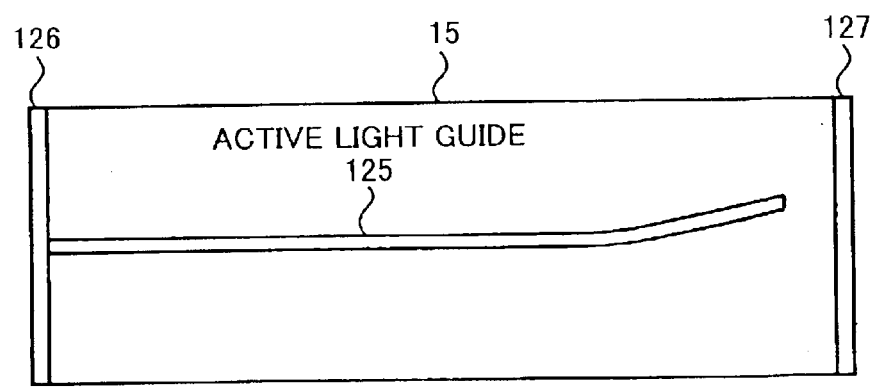
FIG. 9 is a diagram showing a suitable structure for the anti-reflection side of the SOA according to the first embodiment of the present invention.

FIG. 9 is a diagram showing a suitable structure for the anti-reflection side of the SOA 15 according to this embodiment. The SOA 15 includes an active light guide 125, a surface 126 with a low- or high-reflection coating or a cleavage, and a surface 127 with an anti-reflection coating. The side of the surface 127 is referred to as the anti-reflection side of the SOA 15. On the anti-reflection side coupled to the AOTF 14, the SOA 15 includes a window structure, and the light guide 125 is tapered and tilted with respect to the normal vector of the output surface 127.

According to this embodiment, the SOA 15 employs the tapered and tilted light guide 125, the window structure, and the anti-reflection coating of the surface 127 in order to minimize reflection particularly around the SOA 15, thereby reducing a ripple in the gain.

In order to improve the stability of the wavelength-selectable laser, all of the above-described components of the wavelength-selectable laser should be provided on a common platform such as a substrate.

Figure 10:
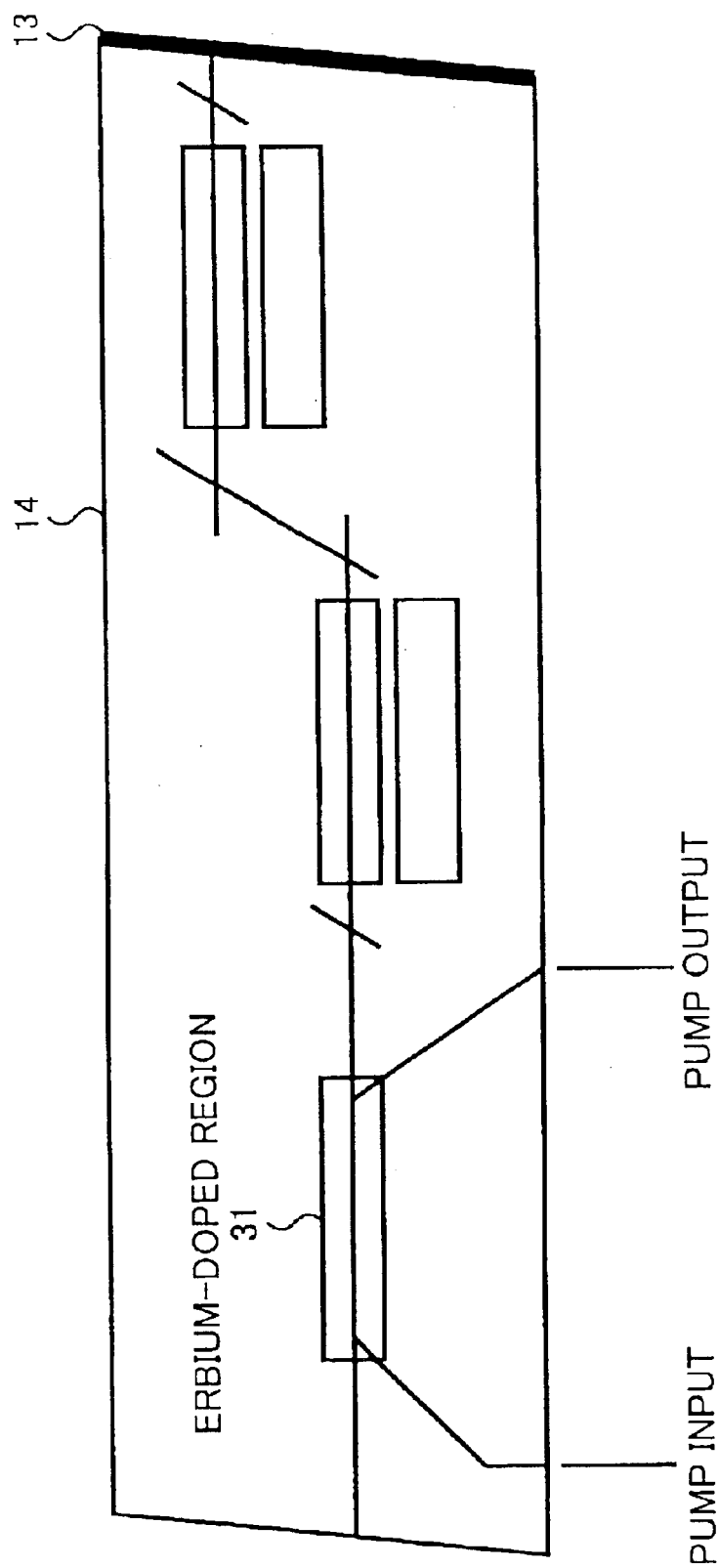
FIG. 10 is a diagram showing another specific configuration of the AOTF according to the first embodiment of the present invention.

Further integration of the wavelength-selectable laser can be realized by using a rare-earth doped light guide made of material that is usable as the material of the AOTF 14. An example of such doped material is erbium-doped $LiNbO_3$. FIG. 10 is a diagram showing a configuration of the AOTF 14 having an erbium-doped region 31.

A description will be given, with reference to FIG. 7B, of a specific configuration of the wavelength-selectable laser according to this embodiment. The SOA (gain medium) 15 was formed of a waveguide having an MQW structure. A detailed configuration of the waveguide (active light guide 125) of the SOA 15 is shown in FIG. 9. The SOA 15 had a low-reflection (LR) coating of approximately 10% provided on one surface thereof and an AR coating provided on the other surface thereof. The AR-coated surface of the SOA 15 was coupled to the AOTF 14. The window structure was 25 μm in length, and the light guide 125 was tilted at 10° and tapered to have a narrowing width toward the output surface of the SOA 15. The reflectivity of the window structure with the coating was $1 \times 10^{-6}$. The internal gain of the SOA 15 was 30 dB with a current of 200 mA.

The AOTF 14 was approximately 2 cm in length, and had a two-stage configuration as shown in FIG. 7B in order to compensate for the Doppler shift. A coupling part was provided between the SOA 15 and the AOTF 14. The AOTF 14 did not have a collimator.

An etalon with a free spectral range of 100 GHz and a finesse of 15 was employed as the etalon 17. A conventional lens having a focal length of 2 mm was employed as each of the collimators 12 and 16. The reflecting mirror 18, which was made of $TiO_2$, had a reflectivity of 98% or higher with respect to a wavelength range of 1400 to 1720 nm. The entire cavity formed between the reflecting mirror 18 and the semi-transmissive mirror 23 was 5 cm in length, and had its components arranged on the waveguide.

Figure 11:
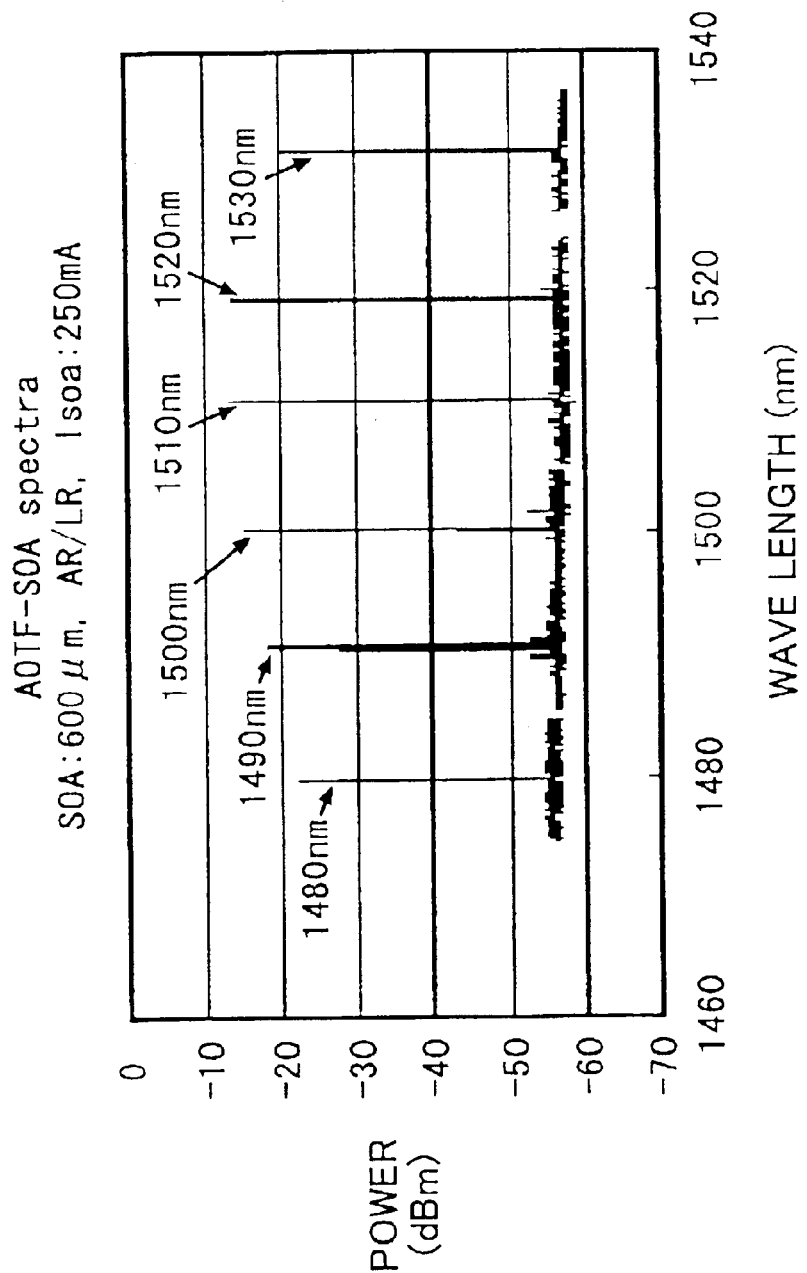
FIG. 11 is a graph showing typical spectra obtained at different lasing wavelengths in the wavelength-selectable laser according to the first embodiment of the present invention.

FIG. 11 is a graph showing typical spectra obtained at different lasing wavelengths in the wavelength-selectable laser according to this embodiment. FIG. 11 shows the spectra of 1480 to 1530 nm wavelengths with a tuning range of 50 nm. An excellent relative intensity noise (RIN) smaller than or equal to −140 dB/Hz was obtained at a frequency of 7.5 GHz, and an SMSR better than 40 dB was obtained.

[Second Embodiment]

An RF signal $f_s$ for causing mode conversion (switching) is applied to the AOTF 3. Supplying the RF signal $f_s$ and controlling its frequency correspond to the frequency controller 4.

A description will be given of a method as to how the RF signal frequency fs can be controlled to the optimum value.

Figure 12:
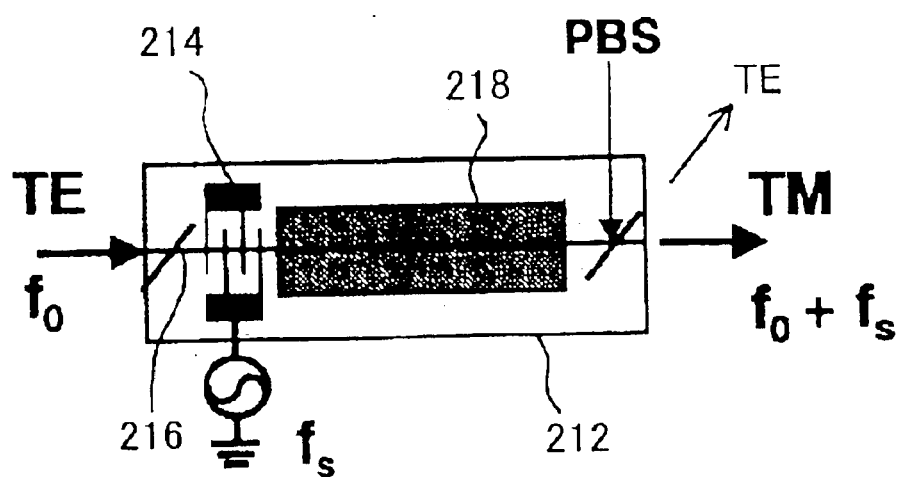
FIG. 12 is an enlarged view of the AOTF according to a second embodiment of the present invention.

FIG. 12 is an enlarged view of the AOTF 3. In the AOTF 3, an inter digital transducer (IDT) 214 is formed on a light waveguide 216 formed on the surface of a $LiNbO_3$ substrate by diffusing Ti ions thereon. When the RF signal is applied to the IDT 214, the medium is excited so as to have condensation and rarefaction corresponding to the RF signal, so that an SAW propagates on a field waveguide 218 on the light waveguide 216. As a result, the polarization mode of the propagating light is converted from TE to TM or TM to TE by the interaction between the SAW and the propagating light. This mode conversion occurs with respect only to light of a specific wavelength corresponding to the frequency of the SAW, which frequency corresponds to the frequency of the RF signal. Accordingly, the frequency of the RF signal and the wavelength (frequency) of light at which mode conversion occurs are uniquely correlated.

When incident light has a polarization mode of TE and a frequency of $f_0$, a polarization beam splitter PBS, which is a polarization wave splitting part and provided on the light waveguide 216 on the substrate 212, causes only part of the incident light which part has been mode-converted to TM to be output along the light waveguide 216. The remaining TE light wave, which has not been mode-converted, is separated from the TM light wave. The frequency of the TM wave is the sum $f_0+f_s$ of the frequencies $f_0$ and $f_s$ of the incident light and the RF signal. Thus, only propagating light subjected to mode conversion is selected and output by the PBS. As a result, the transmission frequency band of the bandpass filter 3 can be controlled variably by controlling the frequency of the RF signal. The frequency $f_s$ of the RF signal is extremely low compared with the frequency $f_0$ of the incident light.

Figure 13A:
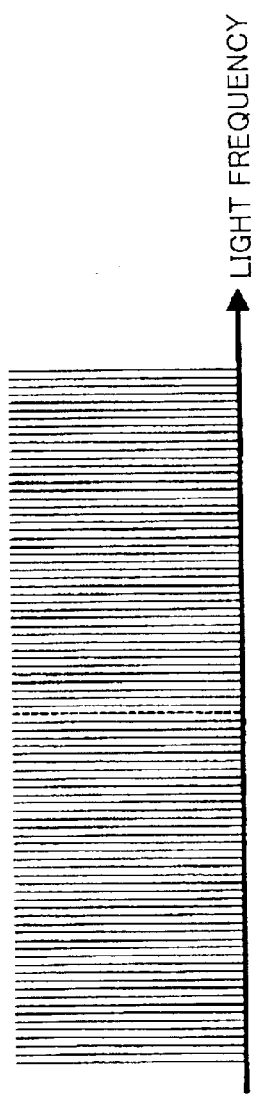
FIGS. 13A through 13C are diagrams showing the principle of wavelength selection in a wavelength-selectable laser employing an AOTF.
Figure 13B:
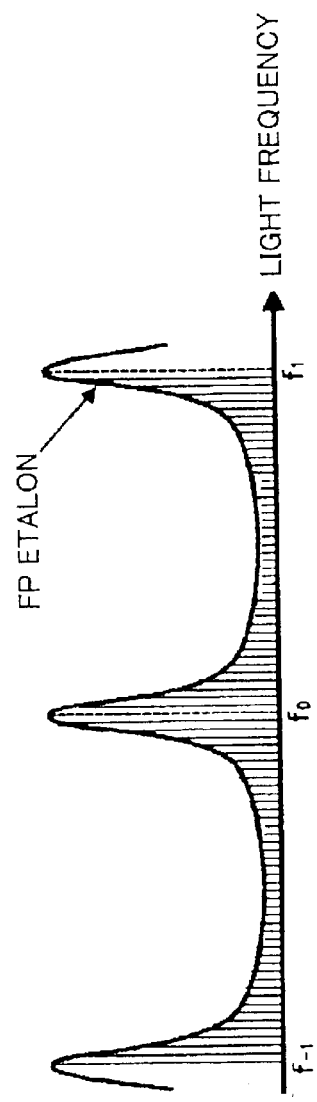
Figure 13C:
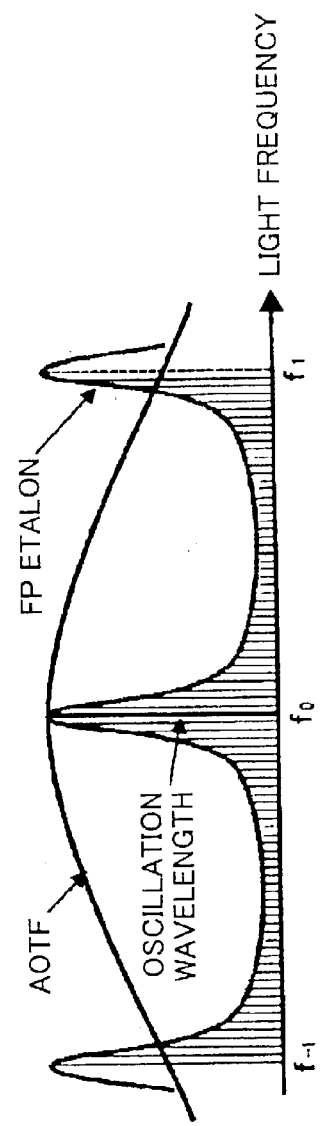

FIGS. 13A through 13C are diagrams showing the principle of wavelength selection in a wavelength-selectable laser employing an AOTF. FIG. 13A shows the same frequency spectra of the longitudinal modes of a resonator as FIG. 5D. Light beams of the discrete frequencies $f_0$, $f_{-1}$, and $f_1$ are selected out of the longitudinal modes by the periodic transmission characteristic of an FP etalon filter as shown in FIG. 13B. Then, as shown in FIG. 13C, the frequency $f_0$ is selected from the discrete frequencies $f_0$, $f_{-1}$, and $f_1$, by the characteristic of the AOTF, so that oscillation at a single longitudinal mode can be realized.

Thus, according to the wavelength-selectable laser of this embodiment, the frequency at which the transmission rate of the AOTF is maximized should be matched with one of the transmission frequencies of the FP etalon filter at which one oscillation is desired to occur. Inclusion of adjacent frequency components, which causes noise in the WDM communication systems, is not desirable. In order to avoid such inclusion, the optical output of the laser may be maximized while controlling the frequency $f_s$ of the RF signal applied to the AOTF.

As shown in FIG. 13C, however, the transmission characteristic of the AOTF has a smooth curve over a relatively wide range. This is because the AOTF is reduced in length with the downsizing of the laser itself. A smaller AOTF has a gentler transmission characteristic. Therefore, the inventors of the present invention have found that if the AOTF has a relatively broad transmission frequency band compared with the free spectral range between periodic transmission frequency bands of the FP etalon filter, the oscillation frequency shifts from the frequency $f_0$ to the adjacent frequency $f_{-1}$ or $f_1$ without any substantial change in the magnitude of the optical output when the peak value of the transmission frequency band of the AOTF is shifted by changing the frequency of the RF signal.

Figure 14:
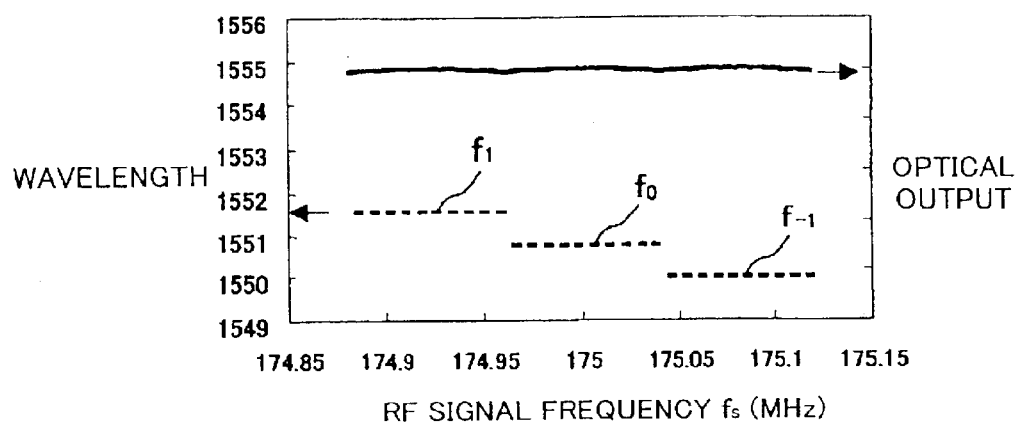
FIG. 14 is a graph showing the relationships among the optical output and the oscillation frequency of the wavelength-selectable laser and the frequency of an RF signal.

FIG. 14 is a graph showing the relationships among the optical output and the oscillation frequency (wavelength) of the wavelength-selectable laser and the frequency of the RF signal. In FIG. 14, the horizontal axis represents the frequency (MHz) of the RF signal and the vertical axis represents the optical output and the oscillation wavelength of the laser. The oscillation wavelengths (frequencies) range from 1.549 to 1.556 μm. In the case of FIG. 6, when the frequency $f_s$ of the RF signal is controlled to around 175 MHz, the oscillation of light occurs at the frequency $f_0$ as indicated by a broken line. When the frequency $f_s$ of the RF signal is increased, the oscillation of light occurs at the adjacent frequency $f_{-1}$, and when the frequency $f_s$ of the RF signal is decreased, the oscillation of light occurs at the other adjacent frequency $f_1$. On the other hand, as indicated by the solid line in FIG. 14, the optical output remains substantially the same although the frequency $f_s$ of the RF signal is changed to shift the oscillation frequency. Accordingly, it is difficult to control the frequency $f_s$ of the RF signal through monitoring the optical output, thus causing reduction in SMSR or multimode oscillation with the result that the oscillation condition of the laser is degraded.

As previously described, in the AOTF, the frequency at which the polarization direction of light is converted, or mode conversion occurs, is uniquely correlated with the frequency $f_s$ of the RF signal. For instance, in the case of $f_s$=175 MHz, mode conversion of light from TE to TM or TM to TE occurs at a wavelength $\lambda$=1.55 μm. When the frequency $f_s$ of the RF signal is changed, mode conversion occurs at a different wavelength of light. Further, in the AOTF, at the same time with the conversion of polarization mode, the frequency of transmitted light is shifted as much as the frequency $f_s$ of the RF signal by the Doppler shift in the field waveguide 218. Accordingly, the frequency of the propagating light beam subjected to mode conversion is shifted to $f_0+f_s$. When the frequency $f_s$ of the RF signal is shifted from its optimum value, the efficiency of mode conversion decreases, so that of the light of the mode conversion frequency $f_0$ corresponding to the frequency $f_s$, the light of the frequency $f_0+f_s$ which light propagates mode-converted has its intensity reduced. On the other hand, the intensity of the light of the frequency $f_0$ which light propagates as a TE wave without being subjected to mode conversion is increased. That is, both the TM wave of the frequency $f_0+f_s$ and the TE wave of the frequency $f_0$ exist and propagate in the field waveguide 218.

On the other hand, when the frequency $f_s$ of the RF signal is the optimum frequency corresponding to the mode conversion frequency $f_0$, the mode conversion efficiency of the light of the frequency $f_0$ is maximized. As a result, most of the light of the frequency $f_0$ is mode-converted to a TM wave, so that the optical intensity of the non-converted TE wave of the frequency $f_0$ is decreased.

In consideration of the above-described characteristic, the inventors of the present invention have found that the frequency $f_s$ of the RF signal can be controlled to an optimum frequency by monitoring the strength of the beat signal of the light of the frequency $f_0+f_s$ and the light of the frequency $f_0$ included in the laser beam. The frequency of the beat signal is the frequency $f_s$ or integral multiples thereof. That is, the RF signal can be set so as to correspond to the desired laser beam frequency $f_0$ by controlling the frequency $f_s$ of the RF signal so as to minimize the magnitude of the beat signal that is N times the frequency $f_s$ of the RF signal included in the output beam of the laser. N is an integer larger than zero. Alternatively, the frequency $f_s$ may be controlled so as to set the magnitude of the beat signal to a value smaller than or equal to a predetermined value.

It is inferred that the beat signal is the integral multiple of the frequency $f_s$ because of a plurality of frequency shifts occurring when the AOTF 3 has a multi-stage configuration or reflection occurs at the end surfaces of the AOTF 3. That is, when the frequency of light shifts to $f_0+2f_s$, $f_0+3f_s$, . . . , the frequency of the beat signal thereby shifts higher to $2f_s$, $3f_s$, . . . . In the case of the above-described AOTF 3 in which the light waveguide 216 is formed on the $LiNbO_3$ substrate 212 by ion diffusion, for instance, the frequency $f_s$ of the RF signal is approximately 175 MHz for selecting light of a 1.55 μm band. As a result, beat signals of frequencies of 175, 350, 525, and 700 MHz are generated. Particularly, the component of the frequency twice the frequency $f_s$ has the largest beat intensity.

Figure 15:
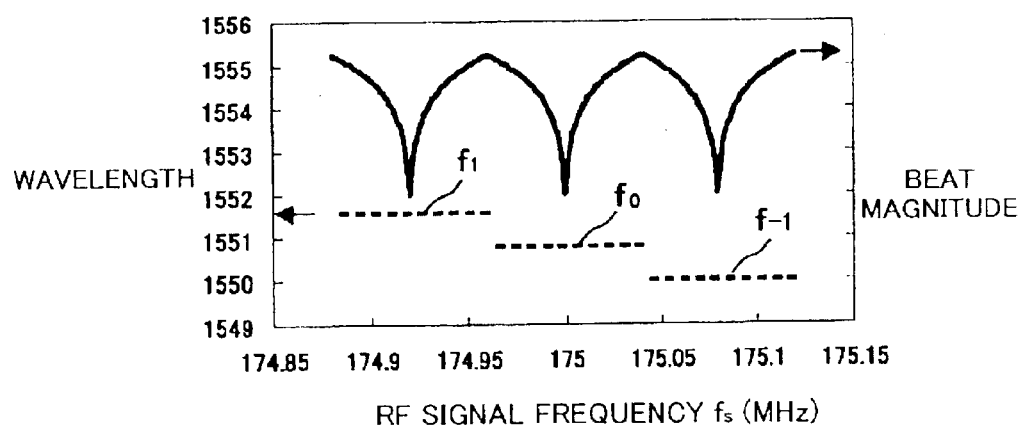
FIG. 15 is a graph showing the relationships among the beat signal of the optical output of the wavelength-selectable laser, the oscillation frequency thereof, and the frequency of the RF signal.

FIG. 15 is a graph showing the relationships among the beat signal of the optical output of the wavelength-selectable laser, the oscillation frequency thereof, and the frequency of the RF signal. The relationship between the frequency $f_s$ of the RF signal and the oscillation frequencies $f_0$, $f_{-1}$, and $f_1$ is the same as that of FIG. 14. In FIG. 15, the solid line indicates the magnitude of the beat signal of the optical output as the frequency $f_s$ of the RF signal is varied. As shown in FIG. 15, when the frequency $f_s$ of the RF signal is set to an optimum value, the mode conversion of propagating light is performed with maximum efficiency so that the strength of the beat signal is minimized. Further, the strength of the beat signal can be minimized at every transmission frequency of the FP etalon filter.

Figure 16:
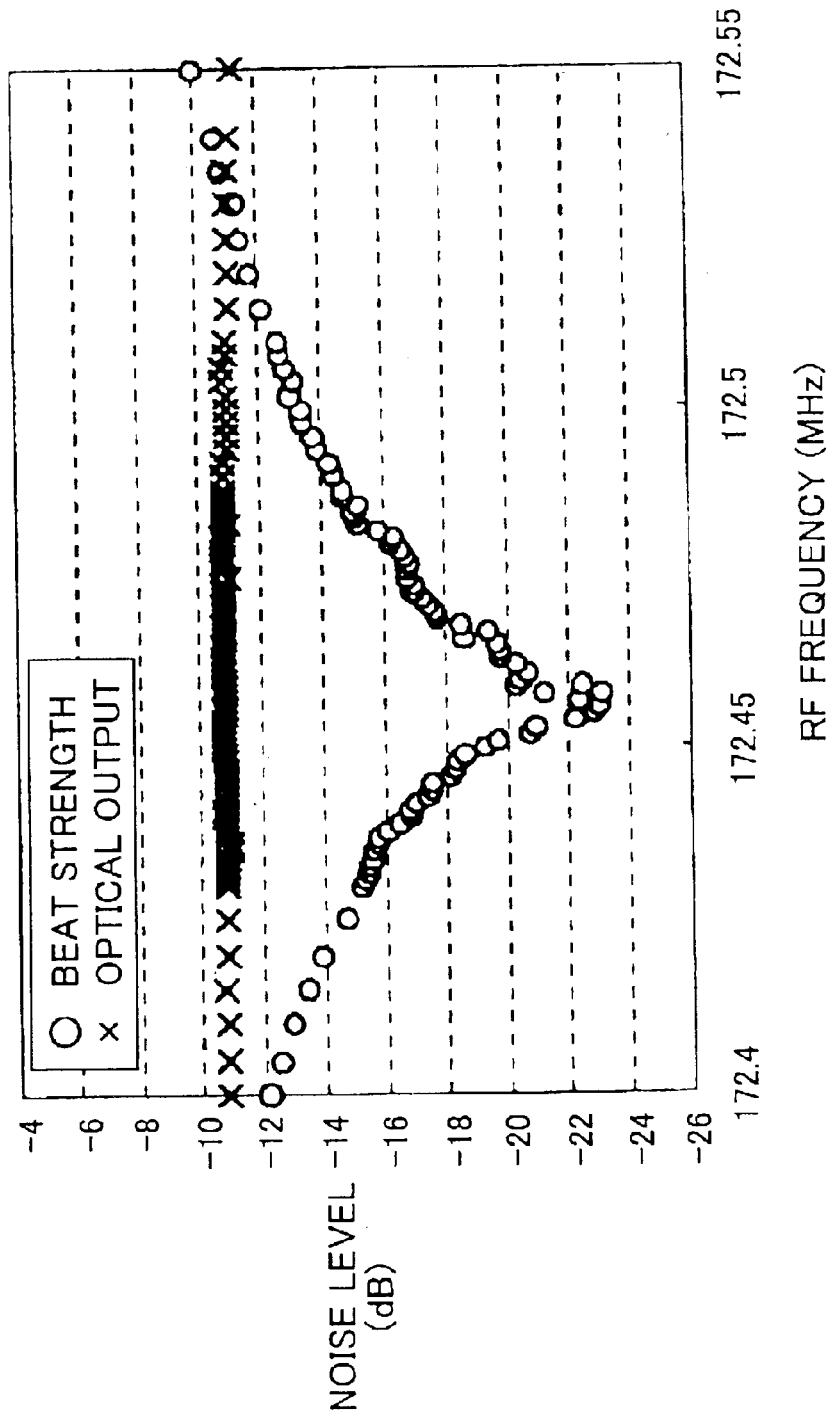
FIG. 16 is a graph showing transmitted light intensity and beat signal strength with respect to the RF signal frequency of the AOTF.

FIG. 16 is a graph showing transmitted light intensity and beat signal strength with respect to the RF signal frequency of the AOTF. In FIG. 16, the horizontal axis represents the frequency $f_s$ of the RF signal and the vertical axis represents noise level. FIG. 16 shows that the transmitted light (output light) intensity indicated by Xs has no dependency on the frequency of the RF signal while the beat signal strength indicated by circles has dependency on the frequency of the RF signal.

Thus, by controlling the frequency $f_s$ of the RF signal so that the beat signal is minimized in magnitude, the wavelength maximizing the transmission strength of the AOTF can match a desired transmission wavelength of the periodic FP etalon filter. Further, the beat signal is increased in magnitude before the oscillation frequency shifts to an adjacent transmission frequency of the FP etalon filter. Therefore, the oscillation frequency can be maintained at a single transmission frequency by monitoring the magnitude of the beat signal. As a result, according to the wavelength-selectable laser of this embodiment, wavelength selection can be performed stably even when the AOTF 3 has a relatively broad wavelength selection range with respect to the free spectral range between transmission frequency bands of the FP etalon filter 5.

Figure 17:
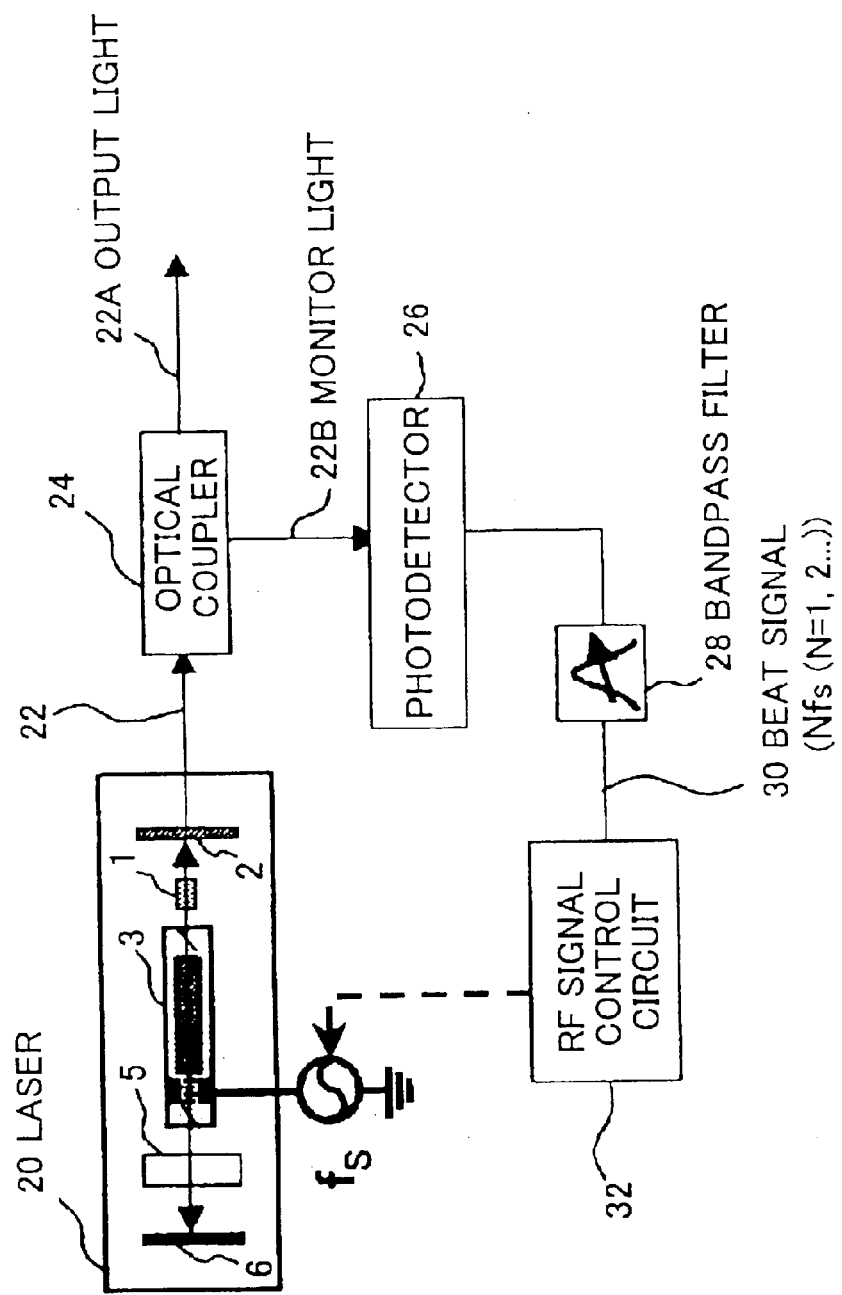
FIG. 17 is a block diagram showing a configuration of the wavelength-selectable laser according to the second embodiment of the present invention.

FIG. 17 is a block diagram showing a configuration of the wavelength-selectable laser according to this embodiment. An optical output 22 of a wavelength-selectable laser 20 having the configuration of FIG. 12 is split into output light 22A and monitor light 22B by an optical coupler 24 so that the monitor light 22B is extracted. The monitor light 22B is converted to an electrical signal by a photodetector 26. Then, the electrical signal is supplied to a bandpass filter 28 so that only the frequency component of a beat signal 30 is extracted. The beat component 30 is supplied to an RF signal control circuit 32, which controls the frequency $f_s$ of the RF signal so that its beat signal strength is minimized. That is, by controlling the frequency $f_s$ of the RF signal so that the frequency $f_s$ corresponds to a desired transmission frequency of the FP etalon filter 5 and the beat signal is minimized around the controlled frequency $f_s$, the laser beam can be controlled to a desired single frequency without the noise of the adjacent frequencies.

The bandpass filter 28 transmits the frequencies that are integral multiples of the frequency $f_s$ of the RF signal; preferably, a frequency component that is double the frequency $f_s$. The beat signal of the frequency component that is double the frequency $f_s$ is the largest in magnitude and has great dependency on the frequency $f_s$ of the RF signal. Thereby, by using the beat signal of such great magnitude, the above-described control can be performed with ease and accuracy.

Figure 18:
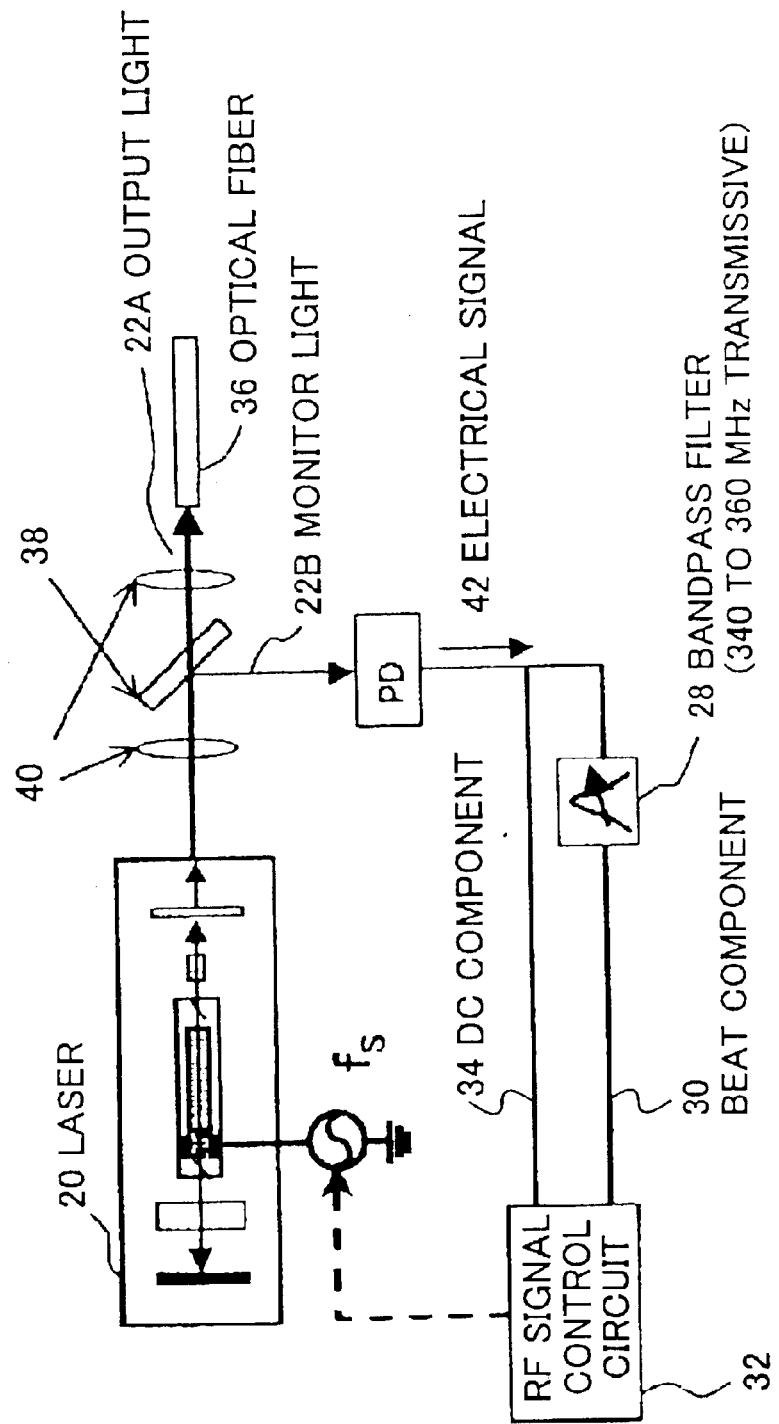
FIG. 18 is a block diagram showing another configuration of the wavelength-selectable laser according to the second embodiment of the present invention.

FIG. 18 is a block diagram showing another configuration of the wavelength-selectable laser according to this embodiment. In this configuration, a half mirror 38 is employed as an optical coupler for separating the monitor light 22B from the output light of the wavelength-selectable laser 20. Further, the monitor light 22B separated and extracted by the half mirror 23 is converted to an electrical signal 42 in a photodiode PD. A DC component 34 of the electrical signal 42 and the beat component 30 thereof transmitted by the bandpass filter 28 are supplied to the RF signal control circuit 32. The RF signal control circuit 32 controls the frequency $f_s$ of the RF signal of the AOTF 3 so that normalized beat signal strength obtained by dividing the beat component 30 by the DC component 34 is minimized or set to be smaller than or equal to a predetermined value. By using the ratio of the beat component 30 to the DC component 34, a normalized value independent of the strength of the output light can be monitored.

In order to set the oscillation frequency to the 1.55 μm band, the frequency $f_s$ of the RF signal is controlled to approximately 175 MHz. The half mirror 38 splits the output light of the laser 20 into the output light 22A and the monitor light 22B with a ratio of 9:1, for instance. The one part monitor light 22B is incident on the photodiode PD for the 1.55 μm band, and the nine parts output light 22A is incident on an optical fiber 36 via lenses 40. The photodiode PD converts the monitor light 22B to the electrical signal 42, and the bandpass filter 28 transmits the component of the electrical signal 42 which component, for instance, is double the frequency $f_s$ of the RF signal applied to the AOTF 3. That is, the bandpass filter 28 transmits the 340 to 360 MHz component of the electrical signal 42. As described above, the frequency $f_s$ of the RF signal is controlled so that the ratio of the beat component 30 to the DC component 34 is minimized or set to be smaller than or equal to a predetermined value. Sensitivity can be increased because the beat signal of the frequency component double the frequency $f_s$ of the RF signal is monitored. Further, it is the ratio of the beat component 30 to the DC component 34 of the electrical signal 42 that is monitored. Therefore, the ratio is normalized in a determined manner even when the monitor light 22B varies in intensity. Accordingly, this ratio is suitably used for controlling the frequency $f_s$ of the RF signal.

Figure 19:
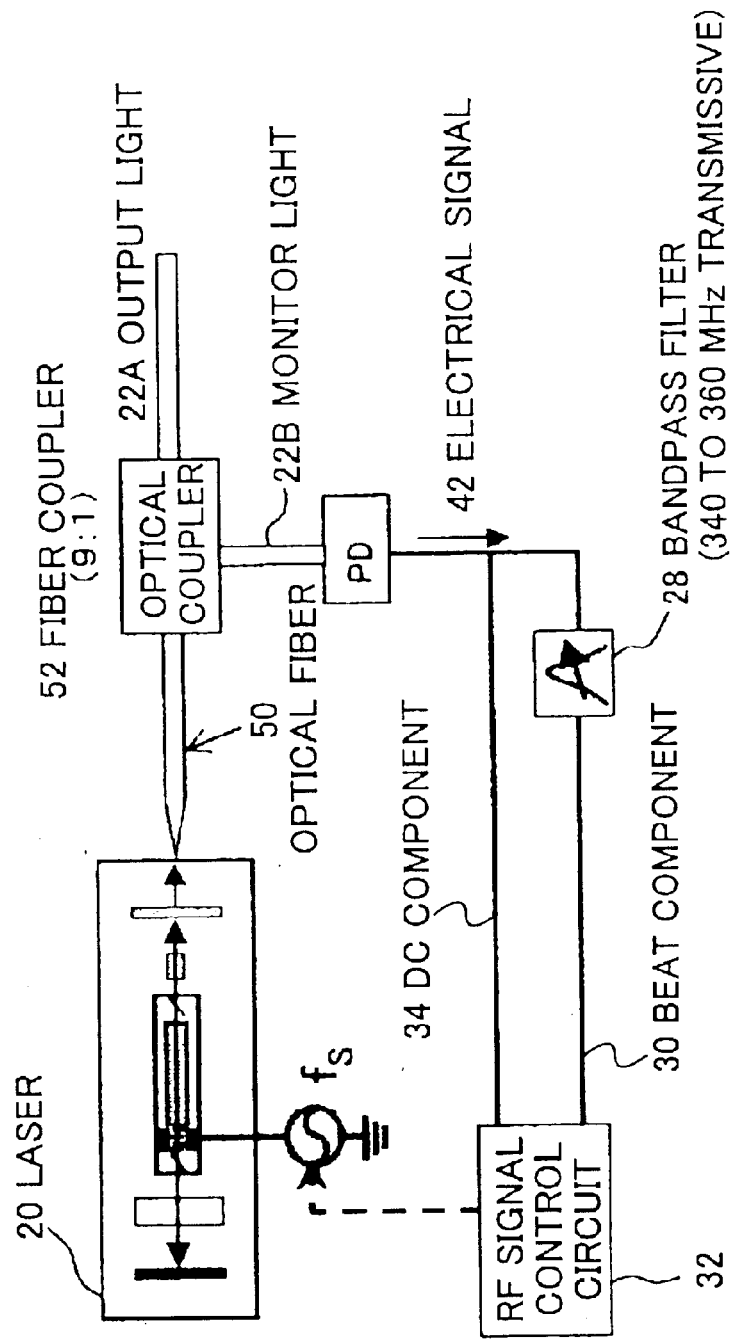
FIG. 19 is a block diagram showing yet another configuration of the wavelength-selectable laser according to the second embodiment of the present invention.

FIG. 19 is a block diagram showing yet another configuration of the wavelength-selectable laser according to this embodiment. In this configuration, the output light of the wavelength-selectable laser 20 is optically coupled to a tapered and sphere-shaped end of an optical fiber 50. Part of the light optically coupled to the optical fiber 50 is extracted as the monitor light 22B by a fiber coupler 52. The output light 22A passing through the fiber coupler 52 is employed as a light source for optical communication through an optical fiber. The rest of the configuration is equal to the corresponding configuration of FIG. 18.

The present invention is not limited to the specifically disclosed embodiments, but variations and modifications may be made without departing from the scope of the present invention.

What is claimed is:

1. A wavelength-selectable laser comprising:
   a resonance region formed by two reflecting surfaces;
   a gain medium generating a laser beam;
   a first filter arranged between the two reflecting surfaces having a first controllable transmission region and transmitting a first predetermined wavelength region of the laser beam generated in said gain medium, the first predetermined wavelength region matching the first controllable transmission region; and
   a second filter arranged between the two reflecting surfaces having a plurality of periodically arranged second transmission regions and transmitting a second predetermined wavelength region of the laser beam transmitted by said first filter, the second predetermined wavelength region matching one of the second transmission regions.

2. The wavelength-selectable laser as claimed in claim 1, wherein said first filter comprises an acousto-optical element.

3. The wavelength-selectable laser as claimed in claim 2, wherein said first filter comprises two stages so as to offset a Doppler shift.

4. The wavelength-selectable laser as claimed in claim 2, wherein said first filter comprises a spot size converter that changes a spot size of the laser beam.

5. The wavelength-selectable laser as claimed in claim 2, wherein said gain medium and said first filter are formed on a common platform.

6. The wavelength-selectable laser as claimed in claim 1, wherein the reflecting surfaces reflect at least a wavelength of the laser beam generated in said gain medium.

7. The wavelength-selectable laser as claimed in claim 1, wherein said second filter is inclined at a predetermined angle to a waveguide of the laser beam.

8. The wavelength-selectable laser as claimed in claim 1, wherein said gain medium is formed of erbium-doped $LiNbO_3$.

9. The wavelength-selectable laser as claimed in claim 8, wherein said gain medium is integrated into said first filter.

10. The wavelength-selectable laser as claimed in claim 1, wherein said gain medium comprises a semiconductor device.

11. The wavelength-selectable laser as claimed in claim 10, wherein said gain medium comprises a spot size converter that changes a spot size of the laser beam.

12. The wavelength-selectable laser as claimed in claim 11, wherein said first filter comprises a spot size converter that changes the spot size of the laser beam.

13. The wavelength-selectable laser as claimed in claim 10, wherein said gain medium and said first filter are joined by butt-joint coupling.

14. The wavelength-selectable laser as claimed in claim 10, wherein at least one of said gain medium and said first filter is inclined at a predetermined angle to a waveguide of the laser beam.

15. The wavelength-selectable laser as claimed in claim 14, wherein said gain medium and said first filter are arranged so that a surface of said gain medium and a surface of said first filter opposing the surface of said gain medium are parallel to each other.

16. The wavelength-selectable laser as claimed in claim 10, wherein said gain medium comprises a window structure.

17. The wavelength-selectable laser as claimed in claim 1, wherein at least one of the reflecting surfaces is formed on at least one of a surface of said gain medium and a surface of said first filter.

18. The wavelength-selectable laser as claimed in claim 1, wherein said second filter is provided in proximity to one of the reflecting surfaces.

19. The wavelength-selectable laser as claimed in claim 1, wherein:
   said second filter and a first reflecting mirror forming a first one of the reflecting surfaces are provided so as to be farthest removed from said gain medium; and
   an output of the wavelength-selectable laser is extracted from a second reflecting mirror forming a second one of the reflecting surfaces.

20. The wavelength-selectable laser as claimed in claim 1, further comprising:
an intensity detection part detecting intensity of a laser output of the wavelength-selectable laser, the intensity detection part being provided to an output end of the wavelength-selectable laser; and
a gain control part controlling an electric current applied to said gain medium based on the intensity of the laser output detected by said intensity detection part.

21. The wavelength-selectable laser as claimed in claim 1, wherein:
the two reflecting surfaces are first and second reflecting mirrors;
said second filter is provided closer to the first reflecting mirror than to the second reflecting mirror; and
an output of the wavelength-selectable laser is extracted from the second reflecting mirror.

22. The wavelength-selectable laser as claimed in claim 21, wherein the first mirror is a reflecting mirror and the second mirror is a partially transmissive mirror.

23. The wavelength-selectable laser as claimed in claim 21, wherein one of the first and second mirrors is formed on one of a surface of said gain medium and a surface of said first filter.

24. A wavelength-selectable laser comprising:
a resonator including two reflecting surfaces,
the resonator comprising:
a gain medium having a broadband gain;
a first filter arranged between the two reflecting surfaces generating a surface acoustic wave in a light waveguide with application of an RF signal and selectively transmitting light of a frequency range corresponding to a frequency of the RF signal; and
a second filter arranged between the two reflecting surfaces having periodic transmission frequency ranges; and
a frequency control part controlling the frequency of the RF signal based on a magnitude of a beat signal included in an output light of said resonator, the beat signal having a frequency N times the frequency of the RF signal, N being an integer larger than zero.

25. The wavelength-selectable laser as claimed in claim 24, wherein said frequency control part controls the frequency of the RF signal so that the magnitude of the beat signal is minimized within a predetermined range of the frequency of the RF signal.

26. The wavelength-selectable laser as claimed in claim 24, wherein said frequency control part controls the frequency of the RF signal so that the magnitude of the beat signal is smaller than or equal to a predetermined value within a predetermined range of the frequency of the RF signal.

27. The wavelength-selectable laser as claimed in claim 24, wherein said frequency control part controls the frequency of the RF signal so that a ratio of the magnitude of the beat signal to a magnitude of the output light is minimized within a predetermined range of the frequency of the RF signal.

28. The wavelength-selectable laser as claimed in claim 24, wherein said frequency control part controls the frequency of the RF signal so that a ratio of the magnitude of the beat signal to a magnitude of the output light is smaller than or equal to a predetermined value within a predetermined range of the frequency of the RF signal.

29. The wavelength-selectable laser as claimed in claim 24, wherein said first filter is an acousto-optical tunable filter that comprises an electrode provided in proximity to the light waveguide, the electrode generating the surface acoustic wave on application of the RF signal thereto, the acousto-optical tunable filter converting a polarization mode of propagating light by the surface acoustic wave so that light having the converted mode is extracted.

30. The wavelength-selectable laser as claimed in claim 24, wherein said second filter is a Fabry-Perot etalon filter.

31. The wavelength-selectable laser as claimed in claim 24, wherein said frequency control part controls the frequency of the RF signal so that the frequency of the RF signal corresponds to a desired one of periodic transmission frequencies transmitted by said second filter so that a laser beam of the desired one of the periodic transmission frequencies is output.

32. The wavelength-selectable laser as claimed in claim 24, wherein the beat signal monitored by said frequency control part has a frequency double the frequency of the RF signal.

33. The wavelength-selectable laser as claimed in claim 24, further comprising:
a separator part separating a part from the output light of said resonator;
a photoelectrical conversion part converting the separated part of the output light to an electrical signal; and
an extraction part extracting a component of the beat signal from the electrical signal,
wherein said frequency control part controls the frequency of the RF signal so that the component of the beat signal is minimized.

34. The wavelength-selectable laser as claimed in claim 33, wherein said separator part comprises a half mirror that partially reflects and partially transmits incident light thereon.

35. The wavelength-selectable laser as claimed in claim 33, further comprising an optical fiber with which the output light of said resonator is coupled,
wherein said separator part comprises a fiber coupler that separates a part from the output light coupled with said optical fiber.

* * * * *